United States Patent
Pandey et al.

(10) Patent No.: US 11,803,009 B2
(45) Date of Patent: Oct. 31, 2023

(54) PHOTONICS STRUCTURES HAVING A LOCALLY-THICKENED DIELECTRIC LAYER

(71) Applicant: GlobalFoundries U.S. Inc., Malta, NY (US)

(72) Inventors: Shesh Mani Pandey, Saratoga Springs, NY (US); Yusheng Bian, Ballston Lake, NY (US); Steven M. Shank, Jericho, VT (US); Judson Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 10 days.

(21) Appl. No.: 17/680,421

(22) Filed: Feb. 25, 2022

(65) Prior Publication Data
US 2023/0273369 A1 Aug. 31, 2023

(51) Int. Cl.
*G02B 6/122* (2006.01)
*G02B 6/136* (2006.01)
*H01L 21/84* (2006.01)

(52) U.S. Cl.
CPC .............. *G02B 6/122* (2013.01); *G02B 6/136* (2013.01); *H01L 21/84* (2013.01)

(58) Field of Classification Search
CPC ................................. G02B 6/122; G02B 6/136
See application file for complete search history.

(56) References Cited

U.S. PATENT DOCUMENTS

| | | | |
|---|---|---|---|
| 6,847,750 B1 * | 1/2005 | Baumann | G02F 1/011 385/16 |
| 8,652,934 B1 * | 2/2014 | Meade | H01L 27/14689 438/424 |
| 8,772,902 B2 | 7/2014 | Assefa et al. | |
| 8,895,413 B2 | 11/2014 | Pinguet et al. | |
| 9,059,252 B1 * | 6/2015 | Liu | G02B 6/12004 |
| 9,646,993 B2 * | 5/2017 | Cheng | H01L 27/1203 |
| 9,799,693 B2 * | 10/2017 | Ellis-Monaghan | G02B 6/4202 |
| 10,156,676 B1 * | 12/2018 | Shank | H01L 31/1136 |
| 10,416,380 B1 * | 9/2019 | Chen | G02B 6/1228 |
| 10,571,633 B1 * | 2/2020 | Chen | G02B 6/136 |
| 10,921,515 B2 * | 2/2021 | Nakashiba | G02F 1/025 |
| 11,169,328 B2 * | 11/2021 | Chern | G02B 6/14 |

(Continued)

FOREIGN PATENT DOCUMENTS

WO WO 2022/066096 A1 * 3/2023

OTHER PUBLICATIONS

Sporer, Ryan et al., "Photonics Chips Including a Fully-Depleted Silicon-on-Insulator Field-Effect Transistor" filed on Aug. 5, 2021 as a U.S. Appl. No. 17/394,770.

(Continued)

*Primary Examiner* — Michael Stahl
(74) *Attorney, Agent, or Firm* — Thompson Hine LLP; Anthony Canale

(57) ABSTRACT

Photonics structures including an optical component and methods of fabricating a photonics structure including an optical component. The photonics structure includes an optical component, a substrate having a cavity and a dielectric material in the cavity, and a dielectric layer positioned in a vertical direction between the optical component and the cavity. The optical component is positioned in a lateral direction to overlap with the cavity in the substrate.

20 Claims, 4 Drawing Sheets

(56) References Cited

U.S. PATENT DOCUMENTS

| | | | | |
|---|---|---|---|---|
| 11,422,303 | B2* | 8/2022 | Levy | G02B 6/136 |
| 2005/0169566 | A1* | 8/2005 | Takahashi | G02F 1/011 |
| | | | | 385/1 |
| 2007/0253663 | A1* | 11/2007 | Keyser | G02B 6/12 |
| | | | | 385/36 |
| 2010/0111461 | A1* | 5/2010 | Takahashi | G02F 1/0147 |
| | | | | 385/1 |
| 2013/0322811 | A1* | 12/2013 | Meade | G02B 6/122 |
| | | | | 438/31 |
| 2014/0241682 | A1* | 8/2014 | Sandhu | G02B 6/12004 |
| | | | | 438/700 |
| 2015/0340273 | A1* | 11/2015 | Jaffe | G02B 6/122 |
| | | | | 438/433 |
| 2018/0128974 | A1* | 5/2018 | Iida | H01L 27/1203 |
| 2021/0294130 | A1* | 9/2021 | Lin | G02F 1/225 |
| 2021/0405298 | A1* | 12/2021 | Lin | G02B 6/1228 |
| 2022/0011507 | A1 | 1/2022 | Chen et al. | |
| 2023/0128786 | A1* | 4/2023 | Sporer | G02B 6/305 |
| | | | | 385/92 |

OTHER PUBLICATIONS

Wilmart, Q. et al., "A Versatile Silicon-Silicon Nitride Photonics Platform for Enhanced Functionalities and Applications," Applied Sciences, 9, 255. https://doi.org/10.3390/app9020255 (2019).

S. K. Selvaraja, and P. Sethi, "Review on Optical Waveguides", in Emerging Waveguide Technology. London, United Kingdom: IntechOpen, [Online]. Available: https://www.intechopen.com/chapters/61838doi: 10.5772/intechopen.77150 (2018).

C. A. Barrios et al., "Demonstration of slot-waveguide structures on silicon nitride / silicon oxide platform," Optics Express 15, 6846-6856 (2007).

Vladimir Stojanovic et al., "Monolithic silicon-photonic platforms in state-of-the-art CMOS SOI processes [Invited]," Optics Express 26, 13106-13121 (2018).

K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, doi: 10.1109/JSTQE.2019.2908790.

M. Rakowski et al., "45nm CMOS—Silicon Photonics Monolithic Technology (45CLO) for next-generation, low power and high speed optical interconnects," in Optical Fiber Communication Conference (OFC), OSA Technical Digest (Optica Publishing Group, 2020), paper T3H.3 (2020).

Y. Bian et al., "Towards low-loss monolithic silicon and nitride photonic building blocks in state-of-the-art 300mm CMOS foundry," in Frontiers in Optics / Laser Science, B. Lee, C. Mazzali, K. Corwin, and R. Jason Jones, eds., OSA Technical Digest (Optica Publishing Group, 2020), paper FW5D.2.

Y. Bian et al., "Monolithically integrated silicon nitride platform," 2021 Optical Fiber Communications Conference and Exhibition (OFC), pp. 1-3 (2021).

Solehmainen, Kimmo, "Fabrication of Microphotonic Waveguide Components on Silicon," VTT Publications 630, 978-951-38-6999-1 (2007).

European Patent Office, Extended European Search Report and Written Opinion issued in European Patent Application No. 22202066.1 dated Jun. 30, 2023 (7 pages).

\* cited by examiner

PHOTONICS STRUCTURES HAVING A LOCALLY-THICKENED DIELECTRIC LAYER

BACKGROUND

The disclosure relates to photonics chips and, more specifically, to photonics structures including an optical component and methods of fabricating a photonics structure including an optical component.

Photonics chips are used in many applications and systems including, but not limited to, data communication systems and data computation systems. A photonics chip integrates optical components, such as waveguides, photodetectors, modulators, and optical power splitters, and electronic components, such as field-effect transistors, into a unified platform. Among other factors, layout area, cost, and operational overhead may be reduced by the integration of both types of components on the same chip.

A silicon-on-insulator substrate may be used to fabricate a photonics chip. The silicon-on-insulator substrate includes a semiconductor layer, a buried insulator layer, and a substrate that is separated from the semiconductor layer by the buried insulator layer. The thickness of the buried insulator layer may selected to optimize the performance of either the optical components or the electronic components.

Improved photonics structures including an optical component and methods of fabricating a photonics structure including an optical component are needed.

SUMMARY

In an embodiment, a photonics structure includes an optical component, a substrate including a cavity and a dielectric material in the cavity, and a dielectric layer positioned in a vertical direction between the optical component and the cavity. The optical component is positioned in a lateral direction to overlap with the cavity in the substrate.

In an embodiment, a method of forming a photonics structure includes forming an optical component, forming a cavity in a substrate, and forming a dielectric material inside the cavity. A dielectric layer is positioned in a vertical direction between the optical component and the cavity, and the optical component is positioned in a lateral direction to overlap with the cavity in the substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
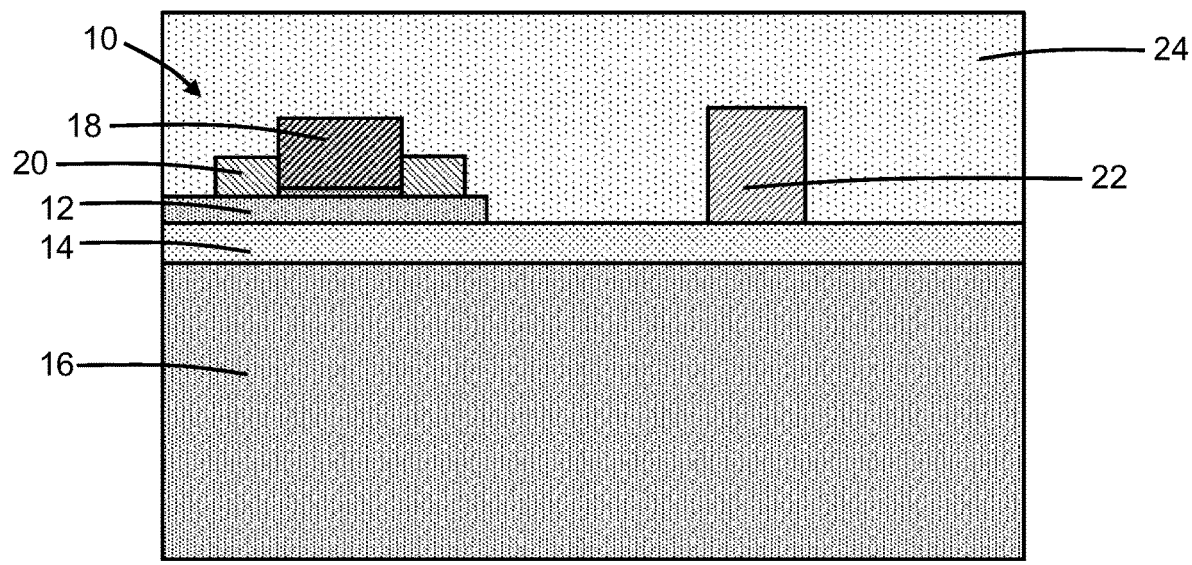
FIGS. 1-4 are cross-sectional views of a photonics structure at successive fabrication stages of a processing method in accordance with embodiments of the invention.

With reference to FIG. 1 and in accordance with embodiments of the invention, a semiconductor-on-insulator substrate includes a device layer 12 defining a layer that contains a semiconductor material, a dielectric layer 14, and a substrate 16. The device layer 12 is separated from the substrate 16 by the intervening dielectric layer 14 and may also be significantly thinner than the substrate 16. The dielectric layer 14 has a lower interface with the substrate 16 and an upper interface with the device layer 12, and the lower and upper interfaces are separated by the thickness of the dielectric layer 14. In an embodiment, the device layer 12 may have a thickness in a range of about 4 nanometers (nm) to about 200 nm. In an embodiment, the device layer 12 may be used to fabricate fully-depleted silicon-on-insulator (FDSOI) device structures as electronic components of a monolithic photonics chip. In an embodiment, the dielectric layer 14 may have a thickness in a range of about 5 nm to about 40 nm. In an embodiment, the dielectric layer 14 may be a buried oxide layer of the silicon-on-insulator substrate.

A field-effect transistor 10 may be formed by front-end-of-line processing as an electronic component in a logic region of the semiconductor-on-insulator substrate. The field-effect transistor 10 may include a gate 18 positioned above the device layer 12, as well as raised source/drain regions 20 on respective sections of the device layer 12 that are adjacent to the gate 18. As used herein, the term "source/drain region" means a doped region of semiconductor material that can function as either a source or a drain of a field-effect transistor. A portion of the device layer 12 that is positioned beneath the gate 18 and laterally between the raised source/drain regions 20 defines a channel region of the field-effect transistor 10. The field-effect transistor 10 may include other elements such as dielectric spacers cladding the gate 18 and a gate dielectric layer that is positioned in a vertical direction between the gate 18 and the device layer 12. During operation, the field-effect transistor 10 may have a depletion region in the channel region that expands in a vertical direction fully through the channel region to the dielectric layer 14 under a typical gate voltage. The dielectric layer 14 is positioned in a vertical direction between the substrate 16 and the field-effect transistor 10.

A waveguide core 22 is formed on the dielectric layer 14 as an optical component in a photonic region of the silicon-on-insulator substrate, which may be distinct from the logic region. In an embodiment, the waveguide core 22 may be formed directly on a top surface of the dielectric layer 14. The waveguide core 22 may be comprised of a dielectric material, such as silicon nitride, having a different composition and higher refractive index than the dielectric layer 14. The waveguide core 22 may be patterned from a deposited layer of the dielectric material by lithography and etching processes. In alternative embodiments, the waveguide core 22 may be comprised of a different dielectric material, such as silicon oxynitride or aluminum nitride. In an alternative embodiment, the waveguide core 22 may be comprised of silicon, such as silicon from the device layer 12. The dielectric layer 14 is positioned in a vertical direction as low index cladding between the substrate 16 and the waveguide core 22.

In the representative embodiment, the waveguide core 22 is embodied in a ridge waveguide core. In an alternative embodiment, the waveguide core 22 may be embodied in a rib waveguide core. In an alternative embodiment, the waveguide core 22 may be embodied in a slot waveguide core. In alternative embodiments, the waveguide core 22 may be part of a more-complex optical component, such as a polarization mode converter, an optical coupler, a multimode interference region, etc.

A dielectric layer 24 is formed that covers the field-effect transistor 10 and the waveguide core 22. The dielectric layer 24 is positioned in a vertical direction over the dielectric layer 14, and the dielectric layer 14 is positioned in a vertical direction between the dielectric layer 24 and the substrate 16. The dielectric layer 24 may be comprised of a dielectric material, such as silicon dioxide, having a different composition and a lower refractive index than the waveguide core 22. The thickness of the dielectric layer 24 may be greater than the height of the field-effect transistor 10 and the thickness of the waveguide core 22 such that the field-effect transistor 10 and the waveguide core 22 are both embedded in the dielectric layer 24.

Figure 2:
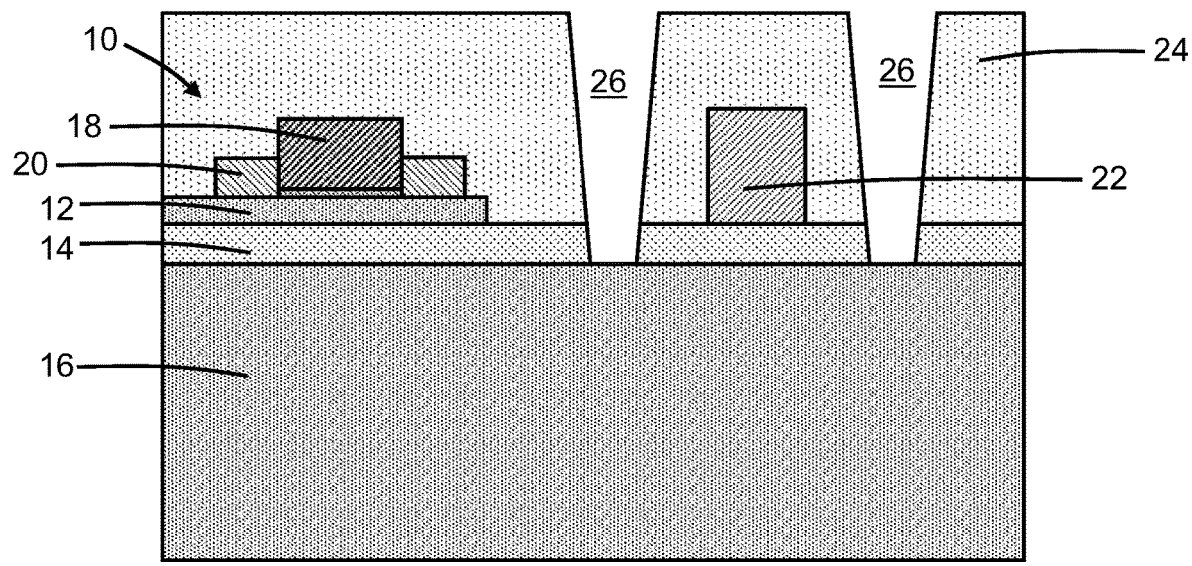

With reference to FIG. 2 in which like reference numerals refer to like features in FIG. 1 and at a subsequent fabrication stage, openings 26 may be patterned by lithography and etching processes that extend through the dielectric layer 24 and the dielectric layer 14 to the substrate 16. The lithography process may form an etch mask comprised of an organic photoresist that is applied by a spin coating process, pre-baked, exposed to light projected through a photomask, baked after exposure, and developed with a chemical developer to define openings in the photoresist at the intended locations for the openings 26. The etching process may be an etching process, such as reactive ion etching, and the etch mask may be stripped after the openings 26 are formed.

Figure 3:
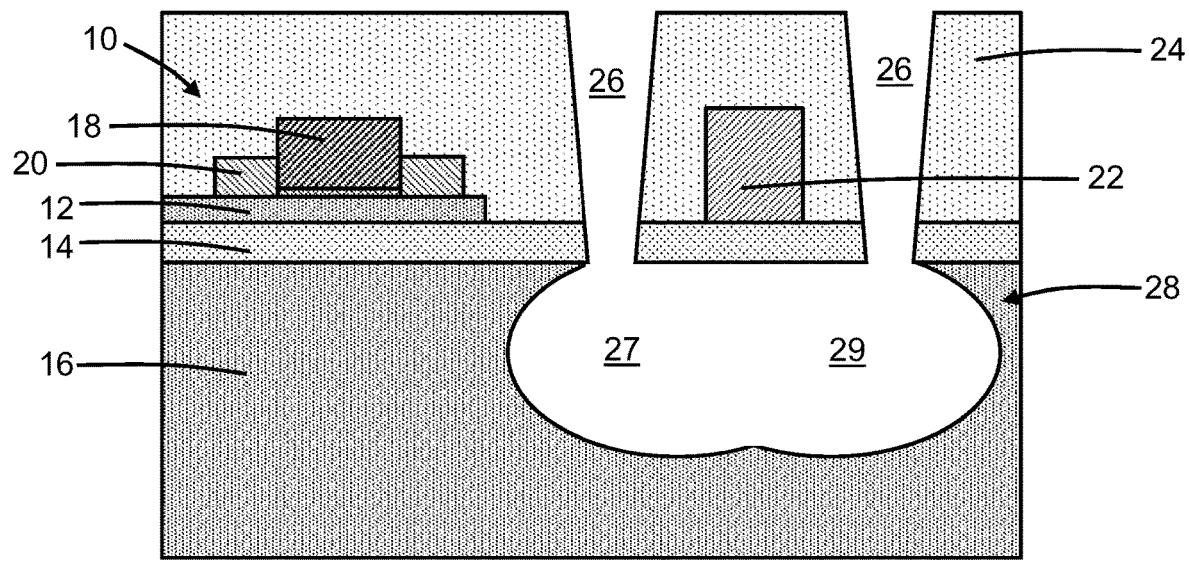

With reference to FIG. 3 in which like reference numerals refer to like features in FIG. 2 and at a subsequent fabrication stage, a cavity 28 is formed in the substrate 16 beneath the interface between the dielectric layer 14 and the substrate 16. In an embodiment, a majority of the cavity 28 in the substrate 16 may be laterally centered between the openings 26. The cavity 28 is surrounded by the semiconductor material of the substrate 16 and is coextensive with the dielectric layer 14 in the space between the openings 26 on different sides of the waveguide core 22. The substrate 16 may be fully removed beneath the waveguide core 22 between the openings 26 to locally expose the lower interface of the dielectric layer 14.

The waveguide core 22 is positioned in a lateral direction to overlap with cavity 28. In an embodiment, the waveguide core 22 may be laterally centered over the cavity 28. The dielectric layer 14 is positioned in a vertical direction between the waveguide core 22 and the cavity 28.

The cavity 28 may be formed by an isotropic etching process that removes the semiconductor material of the substrate 16 selective to the dielectric material of the dielectric layer 14. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal process. The etching of the cavity 28 initiates at the locations of the openings 26 and proceeds both vertically and laterally into the substrate 16. In that regard, the isotropic etching process includes a vertical etching component that deepens the cavity 28 and a lateral etching component that widens the cavity 28. The cavity 28 may include an oval-shaped chamber or portion 27 and an oval-shaped chamber or portion 29 that is partially overlapped with the oval-shaped portion 27. The oval shapes may arise from the isotropic etching process initiating at the different openings 26 and expanding the portions 27, 29 both laterally and vertically.

Figure 4:
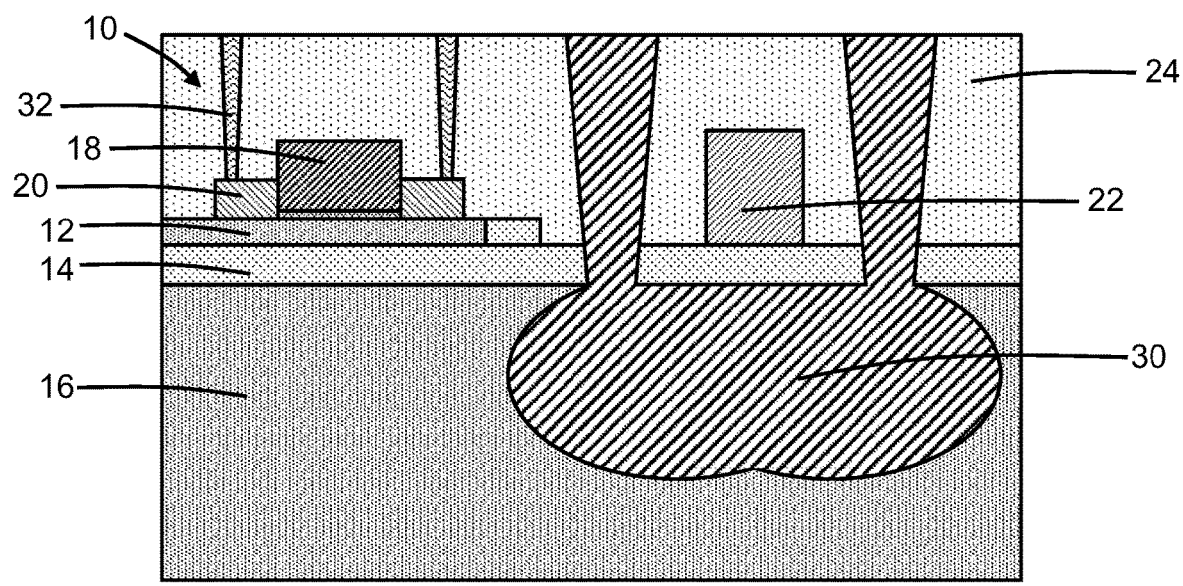

With reference to FIG. 4 in which like reference numerals refer to like features in FIG. 3 and at a subsequent fabrication stage, a dielectric layer 30 comprised of a dielectric material is formed inside the cavity 28. In an embodiment, the dielectric material of the dielectric layer 30 may fully fill the entire volume of the cavity 28. In particular, the dielectric layer 30 may be coextensive (i.e., share a boundary) with the portion of the dielectric layer 14 in the space between the openings 26 and beneath the waveguide core 22. In an embodiment, the dielectric layer 30 may be fully coextensive with the portion of the dielectric layer 14 in the space between the openings 26 and beneath the waveguide core 22. In an embodiment, the dielectric layer 30 may directly contact the portion of the dielectric layer 14 between the openings 26 and beneath the waveguide core 22. In an embodiment, the dielectric layer 30 may directly contact the substrate 16 surrounding the cavity 28 and the portion of the dielectric layer 14 between the openings 26.

The waveguide core 22 is positioned in a lateral direction to overlap with the dielectric material of the dielectric layer 30 in the cavity 28. In an embodiment, the waveguide core 22 may be laterally centered over the dielectric material of the dielectric layer 30 in the cavity 28. The dielectric layer 14 is positioned in a vertical direction between the waveguide core 22 and the dielectric material of the dielectric layer 30 in the cavity 28.

In an embodiment, the dielectric material of the dielectric layer 30 may have a refractive index that is substantially equal to the refractive index of the dielectric material of the dielectric layer 24. In an embodiment, the dielectric material of the dielectric layer 30 may have a refractive index that is substantially equal to the refractive index of the dielectric material of the dielectric layer 14. In an embodiment, the dielectric layer 30 may be comprised of the same dielectric material as the dielectric layer 14. In an embodiment, the dielectric layer 30 may be comprised of the same dielectric material as the dielectric layer 24. In an embodiment, the dielectric layer 30 may be comprised of silicon dioxide. In an alternative embodiment, the dielectric layer 30 may be comprised of a dielectric material having a different composition and substantially different refractive index than the dielectric material constituting the dielectric layer 14 and/or the dielectric layer 24.

Portions of the dielectric layer 30 may also fill and occlude the openings 26 in order to seal the cavity 28. Contacts 32 may be formed in the dielectric layer 24 that are connected to the field-effect transistor 10.

The dielectric layer 30 effectively increases the local thickness of dielectric material providing low-index cladding beneath the waveguide core 22 without modifying the thickness of dielectric material beneath the field-effect transistor 10. The locally-increased thickness of dielectric material beneath the waveguide core 22 may be effective to reduce optical loss from the waveguide core 22 while permitting a significantly thinner thickness of dielectric material that includes only the dielectric layer 14 beneath the field-effect transistor 10.

Figure 5:
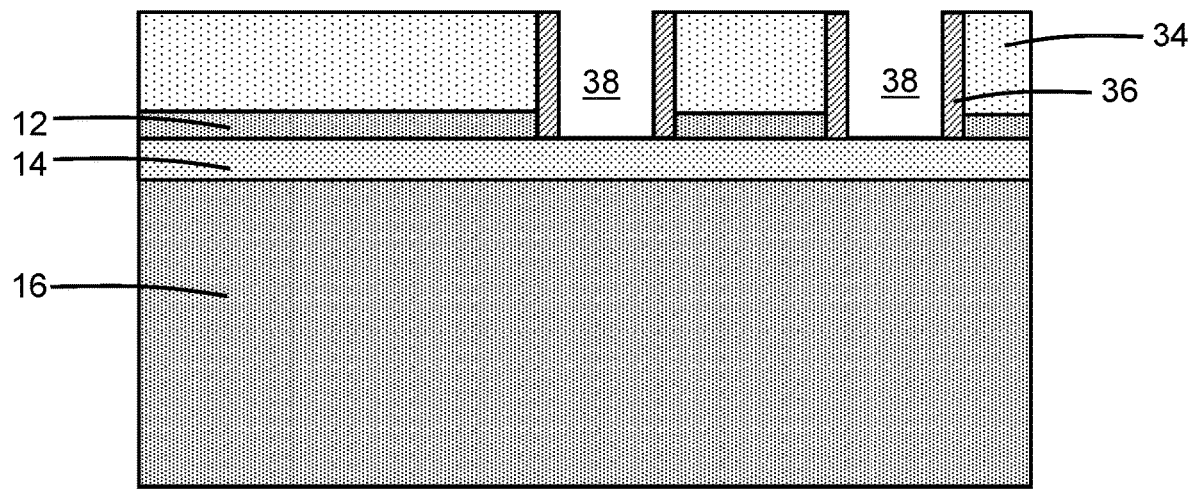
FIGS. 5-7 are cross-sectional views of a photonics structure at successive fabrication stages of a processing method in accordance with alternative embodiments of the invention.

With reference to FIG. 5 and in accordance with alternative embodiments, a dielectric layer 34 may be formed as a hardmask on the device layer 12 and patterned by lithography and etching processes to define openings 36 extending through the device layer 12. Spacers 38 may be formed on the sidewalls of the openings 36. The spacers 38 may be formed by directionally etching a conformally-deposited dielectric layer comprised of a dielectric material, such as silicon dioxide. The spacers 38 are laterally positioned between the device layer 12 and the openings 36.

Figure 6:
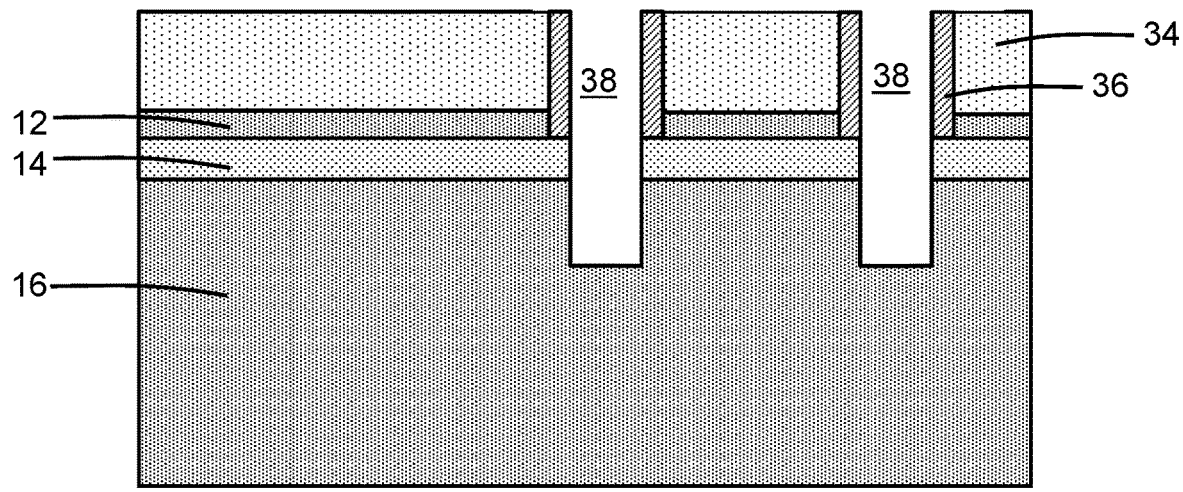

With reference to FIG. 6 in which like reference numerals refer to like features in FIG. 5 and at a subsequent fabrication stage, the openings 26 may be patterned by lithography and etching processes to extend through the dielectric layer 14 and into the substrate 16. The spacers 38 cover and protect the device layer 12 when forming the openings 26.

Figure 7:
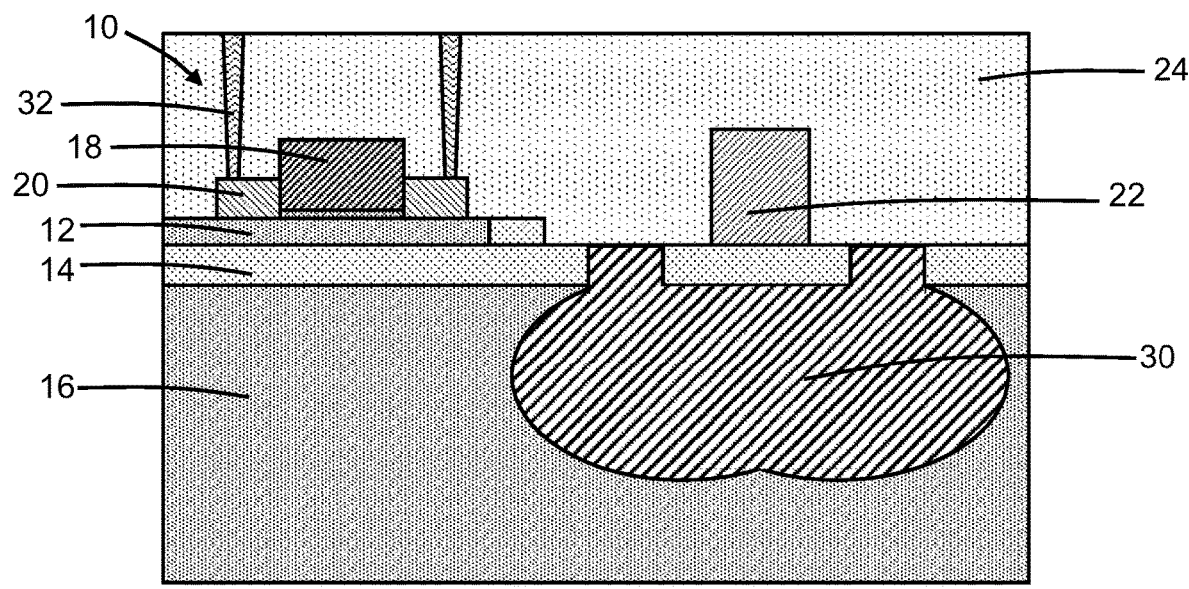

With reference to FIG. 7 in which like reference numerals refer to like features in FIG. 6 and at a subsequent fabrication stage, the cavity 28 is formed in the substrate 16 beneath the interface between the substrate 16 and the dielectric layer 14. The spacers 38 cover and protect the device layer 12 when forming the cavity 28. The dielectric layer 30 is then formed inside the cavity 28. The portions of the dielectric layer 30 inside the openings 26 are fully positioned at and below the top surface of the dielectric layer 14. The dielectric layer 34 and spacers 38 are removed after the cavity 28 is formed. The field-effect transistor 10 and waveguide core 22 are then respectively formed, as previously described, and the dielectric layer 24 is formed over the field-effect transistor 10 and waveguide core 22.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A photonics structure comprising:
   an optical component;
   a substrate including a cavity and a first dielectric material in the cavity;
   a first dielectric layer including a first portion positioned in a vertical direction between the optical component and the cavity, the first dielectric layer having a thickness in a range of about 5 nanometers to about 40 nanometers;
   a semiconductor layer on a second portion of the first dielectric layer, the semiconductor layer having a thickness in a range of about 4 nanometers to about 200 nanometers; and
   an electronic component separated from the substrate by the second portion of the first dielectric layer,
   wherein the optical component is positioned in a lateral direction to overlap with the cavity in the substrate.

2. The photonics structure of claim 1 further comprising:
   a second dielectric layer positioned in the vertical direction over the optical component and the first dielectric layer,
   wherein the second dielectric layer comprises a second dielectric material, the first dielectric material has a first refractive index, and the second dielectric material has a second refractive index that is substantially equal to the first refractive index.

3. The photonics structure of claim 1 wherein the cavity is fully filled by the first dielectric material.

4. The photonics structure of claim 1 wherein the first dielectric layer comprises a second dielectric material, and the second dielectric material has the same composition as the first dielectric material.

5. The photonics structure of claim 1 wherein the first dielectric material has a first refractive index, and the first dielectric layer comprises a second dielectric material having a second refractive index that is substantially equal to the first refractive index.

6. The photonics structure of claim 1 wherein the first dielectric layer comprises a second dielectric material, and the second dielectric material has a different composition than the first dielectric material.

7. The photonics structure of claim 1 wherein the first dielectric layer comprises a second dielectric material, and the second dielectric material has a different refractive index than the first dielectric material.

8. The photonics structure of claim 1 wherein the first dielectric layer includes a first opening extending through the first dielectric layer to the cavity, and the first dielectric material is located in the first opening.

9. The photonics structure of claim 8 wherein the first dielectric layer includes a second opening extending through the first dielectric layer to the cavity, the optical component is laterally positioned between the first opening and the second opening, and the first dielectric material is located in the second opening.

10. The photonics structure of claim 1 wherein the optical component is a waveguide core, and the electronic component is a field-effect transistor.

11. The photonics structure of claim 1 wherein the cavity includes a first oval-shaped portion and a second oval-shaped portion that is overlapped with the first oval-shaped portion.

12. The photonics structure of claim 1 wherein the first dielectric layer includes a first opening and a second opening each extending through the first dielectric layer to the cavity, and the optical component is laterally positioned between the first opening and the second opening.

13. The photonics structure of claim 12 wherein the first dielectric material is located in the first opening and the second opening.

14. A method of forming a photonics structure, the method comprising:
   forming an optical component;
   forming a cavity in a substrate; and
   forming a first dielectric material inside the cavity,
   wherein a first dielectric layer includes a first portion that is positioned in a vertical direction between the optical component and the cavity, an electronic component is separated from the substrate by a second portion of the first dielectric layer, the first dielectric layer has a thickness in a range of about 5 nanometers to about 40 nanometers, a semiconductor layer is positioned on the second portion of the first dielectric layer, the semiconductor layer has a thickness in a range of about 4 nanometers to about 200 nanometers, and the optical component is positioned in a lateral direction to overlap with the cavity in the substrate.

15. The method of claim 14 further comprising:
   forming a second dielectric layer positioned in the vertical direction over the optical component and the first dielectric layer,
   wherein the second dielectric layer comprises a second dielectric material, the first dielectric material has a first refractive index, and the second dielectric material has a second refractive index that is substantially equal to the first refractive index.

16. The method of claim 14 wherein the cavity is fully filled by the first dielectric material.

17. The method of claim 14 wherein the first dielectric layer comprises a second dielectric material, and the second dielectric material has a different composition than the first dielectric material.

18. The method of claim 14 further comprising:
   forming a first opening and a second opening each extending through the first dielectric layer,
   wherein the cavity is formed using the first opening and the second opening, the optical component is laterally positioned between the first opening and the second opening, and the first dielectric material is formed in the first opening and the second opening.

19. The photonics structure of claim 10 wherein the field-effect transistor includes a gate positioned above the semiconductor layer.

20. The photonics structure of claim 19 wherein the first dielectric layer has a top surface, and the waveguide core is positioned directly on the top surface of the first dielectric layer.

* * * * *